United States Patent [19]

Lea et al.

[11] Patent Number: 4,494,081
[45] Date of Patent: Jan. 15, 1985

[54] VARIABLE FREQUENCY U. H. F. LOCAL OSCILLATOR FOR A TELEVISION RECEIVER

[75] Inventors: Jeffrey G. Lea, Noblesville; David J. Carlson, Indianapolis, both of Ind.

[73] Assignee: RCA Corporation, New York, N.Y.

[21] Appl. No.: 381,735

[22] Filed: May 24, 1982

[51] Int. Cl.³ .......................... H03L 7/00; H03B 5/18
[52] U.S. Cl. ........................ 331/36 C; 331/117 R; 331/177 V; 332/30 V
[58] Field of Search ............ 331/36 C, 117 R, 177 V; 332/30 V

[56] References Cited

U.S. PATENT DOCUMENTS

| 3,492,514 | 1/1970 | Korn | 307/320 |
| 3,517,352 | 6/1970 | Marshall et al. | 334/15 |
| 4,074,209 | 2/1978 | Lysobey | 331/117 R X |
| 4,214,217 | 7/1980 | Saito et al. | 334/45 |
| 4,316,108 | 2/1982 | Rogers, Jr. | 307/521 |
| 4,369,417 | 1/1983 | Kupfer | 334/15 |
| 4,375,621 | 3/1983 | Schneiter et al. | 332/16 |
| 4,402,089 | 8/1983 | Knight et al. | 455/186 |

FOREIGN PATENT DOCUMENTS 2494929 5/1982 France .
1095605 12/1967 United Kingdom .
1144015 3/1969 United Kingdom .
1173075 12/1969 United Kingdom .
1178325 1/1970 United Kingdom .
1299816 12/1972 United Kingdom .
1526138 9/1978 United Kingdom .

OTHER PUBLICATIONS

Shea, Harmonic Oscillators, Section 8.1 and 8.2, pp. 221–223, 1957.

Primary Examiner—Eugene R. LaRoche
Assistant Examiner—Robert J. Pascal
Attorney, Agent, or Firm—Eugene M. Whitacre; Paul J. Rasmussen; Peter M. Emanuel

[57] ABSTRACT

A tunable oscillator develops a signal having a frequency variable over a range of frequencies in response to a control signal. A frequency determining resonant circuit includes two voltage-variable capacitance diodes in an arrangement for adjusting at least one endpoint of the frequency range. As a result, the relationship between the magnitude of the control signal and the frequency of the oscillator signal can be adjusted while avoiding mechanically adjustable reactive elements. The disclosed arrangement is suitably employed with resonant circuits other than those in oscillators.

9 Claims, 4 Drawing Figures

VARIABLE FREQUENCY U. H. F. LOCAL OSCILLATOR FOR A TELEVISION RECEIVER

The present invention relates generally to oscillators, and in particular, to variable frequency oscillators.

In the tuning system of a television receiver, a radio frequency (RF) carrier corresponding to a desired television (TV) channel is heterodyned with a signal from a local oscillator to produce a signal at a predetermined intermediate frequency (IF). So that RF carriers over a wide range of frequencies may be heterodyned to a predetermined intermediate frequency, the frequency of the local oscillator is varied in response to a tuning voltage developed in accordance with the selected TV channel.

Adjustment of the minimum and maximum frequencies of the local oscillator signal is necessary to ensure that RF carriers having minimum and maximum frequencies can be heterodyned to the predetermined intermediate frequency. Making these adjustments at high frequencies with mechanically adjustable reactive elements (i.e., inductances and capacitances) is difficult because the nearness of an adjustment tool or the hand of a person making the adjustment to the oscillator can alter its frequency. This problem is particularly acute in a double-conversion television tuning system, i.e. one in which there are two frequency conversions. For example, in a double-conversion tuner in which the first conversion produces an IF signal at 415.75 megahertz (MHz), the frequency of the local oscillator for the UHF band (470 to 890 MHz) must be variable between 887 and 1301 MHz.

This adjustment problem can be substantially eased if at least some of the mechanically-tuned inductors and capacitors for adjusting the tuned circuits of the oscillator can be eliminated.

To that end, the present invention comprises an inductance and first and second variable capacitance devices coupled in a tuned circuit. A control potential is applied across each of the first and second capacitance devices in like sense and a device causes the respective potentials applied across the first and second capacitance devices to differ by a predetermined amount.

Figure 1:
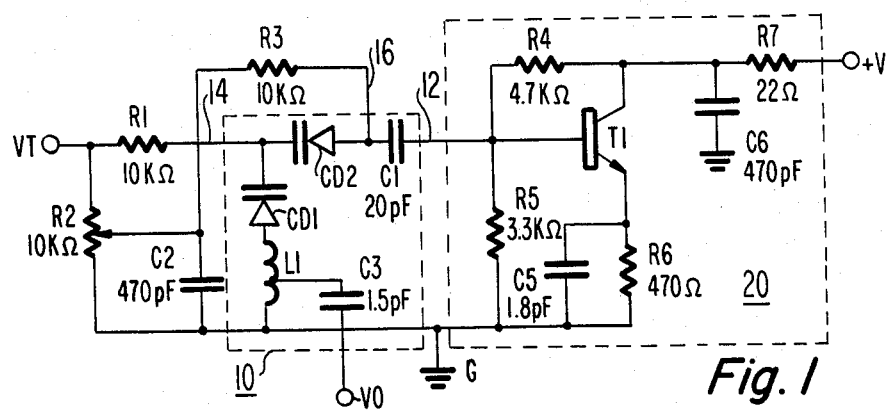
FIG. 1 is schematic diagram of an oscillator circuit embodying the present invention.

FIG. 1 shows a variable frequency UHF local oscillator comprising amplifier 20 and resonant circuit 10. Amplifier 20 includes NPN bipolar transistor T1 which receives positive operating voltage at its collector from supply voltage terminal +V through resistor R7. T1 is biased as an amplifier by a voltage divider including resistors R4 and R5 applying a portion of its collector voltage to its base. The emitter of T1 is coupled to ground G through a parallel connection of resistor R6 and capacitor C5. The collector of T1 is coupled to ground G through capacitor C6.

Transistor T1 is biased in its active operating region to exhibit a gain substantially in excess of unity. Regenerative feedback is introduced into amplifier 20 by various reactances so that it will be unstable and, therefore, oscillatory over a band of frequencies. These reactances comprise that of capacitors C5 and C6, and the reactance of the internal capacitance between the collector and base of T1, as well as the reactance of a circuit (to be described below) connected between connection 12 and ground G. The values of these reactances are selected so that amplifier 20 exhibits a negative impedance at connection 12 over a range of frequencies broader than, for example, the 887 MHz to 1301 MHz frequency range required for a UHF local oscillator in a double-conversion television tuning system having a 415.75 MHz first intermediate frequency.

The particular frequency of oscillation of amplifier 20 is determined by a resonant circuit 10 coupled between connection 12 and ground G. Resonant circuit 10 comprises a series connection of an inductance L1 and a capacitance including variable capacitance diodes CD1 and CD2 and capacitor C1. The series resonant frequency of circuit 10 determines the frequency at which amplifier 20 oscillates. A local oscillator output signal is coupled from a tap connection on inductance L1 to output terminal VO through capacitor C3.

The oscillation frequency of the oscillator of FIG. 1 is controlled by positive tuning potential VT applied through resistor R1 to the cathodes of capacitance diodes CD1 and CD2 at interconnection 14. Because the anode of CD1 is coupled to ground G through inductor L1 and the anode of CD2 is coupled to ground G through resistors R3 and R2, tuning potential VT is applied to CD1 and CD2 in like sense. That is, an increase in tuning potential VT causes the respective potentials between the cathodes and anodes of each of CD1 and CD2 to each increase, and vise versa.

For purposes of the following description, assume that the wiper of potentiometer R2 is at the end of R2 closest to ground G so that the quiescent potential at the anode of capacitance diode CD2 is substantially ground G potential. Therefore, substantially the same potential, namely VT, is applied across each of CD1 and CD2. When tuning potential VT is reduced to its minimum value, CD1 and CD2 each receive minimum applied potential and exhibit maximum capacitance thereby causing resonant circuit 10 to have its minimum resonant frequency. In this condition, amplifier 20 oscillates at its minimum frequency. On the other hand, when tuning potential VT is increased to its maximum value, CD1 and CD2 each receive maximum applied potential and exhibit minimum capacitance thereby causing resonant circuit 10 to resonate at its maximum frequency. In this condition, amplifier 20 oscillates at its maximum frequency.

Figure 2:
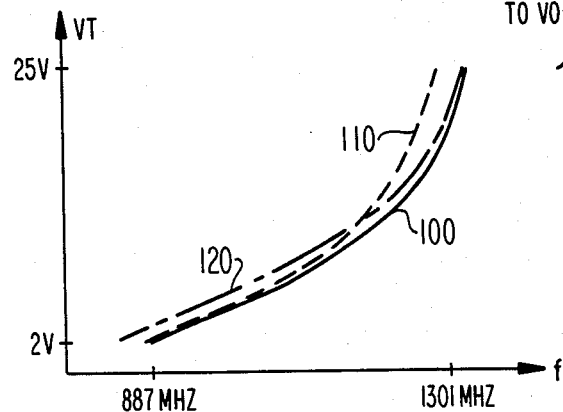
FIG. 2 is a graph useful in understanding the operation of the circuit of FIG. 1.

For the conditions just described, the oscillator of FIG. 1 will oscillate at a frequency in a band of frequencies related to tuning potential VT as represented by solid curve 100 of FIG. 2.

So that the actual range of the oscillation frequency of amplifier 20 will include at least the required range of 887–1301 MHz, for example, it is necessary to adjust or "trim" the values of inductances or capacitances in the circuit. At these high frequencies, however, the presence of a person's hand or an adjustment tool proximate to the circuit will cause its oscillating frequency to change and thus make such adjustment difficult.

That problem is significantly reduced when the highest oscillation frequency is adjusted electronically. This is conveniently accomplished by making the potential applied to diode CD2 differ by a predetermined amount from that applied to diode CD1. To this end for the upper frequency adjustment, a predetermined portion of tuning potential VT is applied to the anode of capacitance diode CD2 via resistor R3 and connection 16 while substantially all of VT is applied to the cathodes of CD1 and CD2.

As the wiper of R2 is moved away from ground G, the portion of tuning potential VT applied to the anode of CD2 is increased. Thus, the potential between the anode and cathode of CD2 is reduced because the portion of VT at connection 16 (the anode of CD2) subtracts from VT at connection 14 (the cathode of CD2). This reduction in the anode to cathode potential of CD2 causes the capacitance of CD2 to increase thereby lowering the frequency of oscillation of amplifier 20 for a given value of VT. This reduction is most pronounced at high frequencies and is represented by dashed curve 110 in FIG. 2. Since the effect of the setting of R2 on frequency is least pronounced at low frequencies, adjustment thereat may satisfactorily be accomplished by adjusting the value of inductor L1 (by mechanical means) or by electronically further modifying the potential across CD2 as described below in relation to FIG. 3. Bypass capacitor C2 exhibits low impedance at the oscillator frequencies to prevent oscillator signals present at connection 12 from being conducted through resistors R3 and R2 and affecting the magnitude of tuning potential VT.

It is noted that the series arrangement of capacitance diodes CD1 and CD2 in circuit 10 serves to reduce the degree to which the ocillator signal changes their effective capacitance. Because CD1 and CD2 are connected in series with respect to the oscillator signal present between connection 12 and ground G, each receives about one half of the amplitude of the oscillator signal. As a result, each exhibits about one half of the capacitance change in the response to the oscillator signal than would otherwise occur. Moreover since CD1 and CD2 are in series, their combined capacitance is about one half the value of the capacitance of each thereby further reducing the effect of oscillator signal amplitude upon capacitance. This advantage is particularly beneficial in the oscillator of FIG. 1 which produces an oscillator signal amplitude at connection 12 of about 5-10 volts with an operating supply voltage +V of about 18 volts with the values shown in FIG. 1. Diodes CD1 and CD2 are BB-105 varactors available from Siemens A. G. (West Germany) and T1 is a 2SC 2026 transistor available from NEC (Japan).

Figure 3:
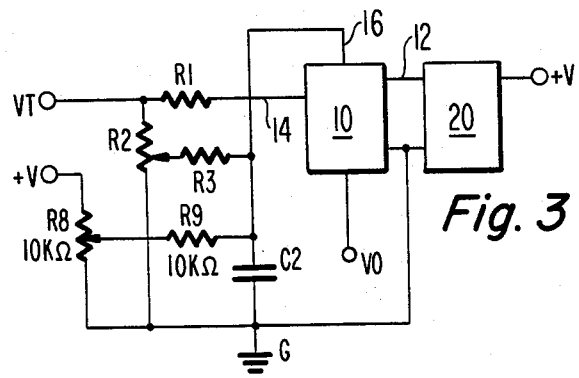
FIGS. 3 and 4 show modifications to the embodiment shown in FIG. 1.

FIG. 3 shows a modification of the oscillator of FIG. 1 to include an arrangement for adjusting the oscillation frequency near the lower frequency end of its range. Resonant circuit 10 and amplifier 20 may be the same as those shown in FIG. 1 and are interconnected in like manner. Low frequency adjustment is accomplished by making the potential applied to diode CD2 differ by a predetermined fixed amount from that applied to diode CD1. Potentiometer R8 applies a predetermined portion of operating potential +V which is not affected by tuning potential VT to resonant network 10 at connection 16 via resistance R9. Potential +V is conveniently the same operating potential as is applied to amplifier 20. The substantially fixed portion of potential +V applied at connection 16 can be of any magnitude which does not exceed the minimum magnitude of tuning potential VT by more than the forward conduction drop of capacitance diode CD2. The voltage applied to the anode of CD2 by potentiometer R8 and resistor R9 subtracts from the tuning potential VT applied at the cathode of CD2. Therefore, it has a more pronounced effect at low values of VT which correspond to the low end of the frequency range of the oscillator. This adjustment characteristic is represented by long-and-short-dashed curve 120 in FIG. 2 for the condition when the wiper of R2 is substantially at ground G potential.

It is noted that the present invention can significantly reduce the need for mechanically adjustable reactive components, such as inductances or capacitances. This advantage is particularly significant in a UHF local oscillator because satisfactory mechanically adjustable reactive elements, if available at all, tend to be expensive. The potentiometers employed in the present invention, on the other hand, need not have special high-frequency characteristics and are inexpensive. Moreover, the potentiometers may be located relatively remotely from the oscillator circuit itself so that the presence of an adjustment tool or the hand of a person making an adjustment is much less likely to have any significant effect on the frequency of the oscillator circuit.

Figure 4:
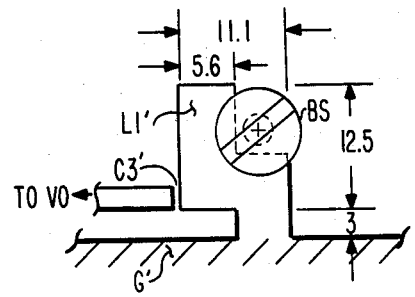

FIG. 4 shows an embodiment of inductor L1 and capacitor C3 employing printed conductors on a substrate which has been found satisfactory when the frequency of the oscillator of FIG. 1 is to be variable over the 887–1301 MHz frequency range. Inductance L1' comprises an area of printed conductor shaped somewhat like the letter "Z" and having the approximate dimensions (in millimeters) shown. Ground G comprises a relatively large area of printed conductor indicated as G'. Capacitance C3' is provided by a gap in the printed conductor serving as the tap connection by which inductor L1' is coupled to output terminal VO. Adjustment of the inductance value exhibited by L1' is provided by a brass screw BS. Screw BS is threaded into an insert in the printed circuit substrate in the area formed by an interior corner of the "Z"-shaped pattern of L1' and has a head of sufficient diameter to project over that area. The closeness of the head of screw BS influences the inductance of L1' without making galvanic connection to the L1' printed conductor area.

Modifications to the above described embodiment are contemplated to be within the scope of the present invention which is limited solely by the claims following. For example, it is satisfactory that only potentiometer R8 be employed so as to apply a predetermined portion of potential +V to one of the capacitance diodes CD1 and CD2. It is also satisfactory that a portion of VT be applied to one of CD1 and CD2 and a portion of +V be applied to the other of CD1 and CD2.

The present invention is satisfactorily employed with apparatus other than an oscillator, such as in a tuned filter or tuned amplifier requiring a resonant network tunable in response to a control potential. It can also be employed in oscillators other than the particular one described herein, for example, in the resonant network of a Colpitts or Hartley type oscillator. The present invention can also be employed in a parallel resonant network in which the series-connected capacitance diodes CD1 and CD2 are coupled in parallel with an inductance.

What is claimed is:
1. An oscillator including amplifying means for exhibiting gain of at least unity including means for providing regenerative feedback to make said amplifying means oscillate, and a resonant circuit coupled to said amplifying means to control the frequency at which said amplifying means oscillates, wherein said resonant circuit is responsive to a control potential to control said frequency, said resonant circuit comprising:

first and second capacitance means having respective pairs of first and second electrodes between which respective capacitances are exhibited, said first electrodes of said pairs of electrodes being of the same type and said second electrodes of said pairs of electrodes being of the same type, the value of said capacitances being controllable responsive to respective potentials developed across said capacitance means, said first and second capacitance means being connected in series with their respective first electrodes connected together;

an inductance to which said first and second capacitance means are connected to form a tuned circuit; and means for developing said potentials across said capacitance means including means for applying said control potential to said first electrodes of each of said first and second capacitance means so as to change the capacitances thereof in the same sense with respect to each other in response to changes of said control signal; and adjustable means connected to said second electrode of said second capacitance means for causing the potential at said second electrode of said second capacitance means to differ from the potential at said second electrode of said first capacitance means by an adjustable amount to cause said potential developed across said first capacitance means to differ in predetermined relationship from said potential developed across said second capacitance means.

2. The oscillator of claim 1 wherein said inductance is coupled in series with said first and second capacitance means.

3. The oscillator of claim 1 wherein said means for causing applies an adjustable portion of said control potential to said second electrode of said second capacitive means.

4. The oscillator of claim 1 wherein said means for causing applies a further potential which is substantially unaffected by said control potential to said second electrode of said second capacitance means.

5. An oscillator comprising:
amplifying means including a regenerative feedback path for making said amplifying means oscillate;

a resonant circuit for determining the frequency at which said amplifying means oscillates including an inductance and first and second voltage variable capacitance diodes each having a pair of first and second electrodes, said first electrodes of said pairs of electrodes being of the same type and said second electrodes of said pairs of electrodes being of the same type;

frequency control means for applying a frequency control signal to the respective first electrodes of said first and second capacitance diodes; and frequency adjustment means for applying an adjustable portion of said frequency control signal to the second electrode of said second capacitance diode.

6. An oscillator comprising:

amplifying means including a regenerative feedback path for making said amplifying means oscillate;

a resonant circuit for determining the frequency at which said amplifying means oscillates including an inductance and first and second voltage variable capacitance diodes each having a pair of first and second electrodes, said first electrodes of said pairs of electrodes being of the same type and said second electrodes of said pairs of electrodes being of the same type;

frequency control means for applying a frequency control signal to the respective first electrodes of said first and second capacitance diodes; and frequency adjustment means for applying first and second potentials to the second electrodes of said first and second capacitance diodes, respectively, said first and second potentials having different magnitudes which are substantially unaffected by the value of said control signal one of said first and second potentials being adjustable.

7. In combination:
respective sources of electrical signals and of a control potential;

a resonant circuit arrangement including an inductance, and first and second capacitance means each having first and second electrodes for providing respective capacitances therebetween, said first electrodes of said pairs of electrodes being of the same type and said second electrodes of said pairs of electrodes being of the same type, the value of said capacitances being controllable responsive to respective potentials developed across said capacitance means, said first and second capacitance means being connected in series with their respective first electrodes connected together;

means for coupling said source of electrical signals to said resonant circuit arrangement; and means for developing said potentials across said capacitance means including means for applying said control potential to said first electrode of each of said first and second capacitance means so as to change the capacitances thereof in the same sense with respect to each other in response to changes of said control potential; and adjustable means connected to the second electrode of said second capacitance means for causing the potential at said second electrode of said second capacitance means to differ from the potential at said second electrode of said first capacitance means by an adjustable amount to cause said potential developed across said first capacitance means to differ in predetermined relationship from said potential developed across said second capacitance means.

8. The combination of claim 7 wherein said means for causing applies an adjustable portion of said control potential to said second electrode of said second capacitance means.

9. The combination of claim 7 wherein said means for causing applies a further potential which is substantially unaffected by said control potential to said second electrode of said second capacitance means.

* * * * *